United States Patent [19]

Schade, Jr.

[11] B  3,982,197

[45] Sept. 21, 1976

[54] RADIATION RESPONSIVE VOLTAGE DIVIDING CIRCUIT

[75] Inventor: Otto Heinrich Schade, Jr., North Caldwell, N.J.

[73] Assignee: RCA Corporation, New York, N.Y.

[22] Filed: Feb. 4, 1974

[21] Appl. No.: 439,542

[44] Published under the second Trial Voluntary Protest Program on January 27, 1976 as document No. B 439,542.

[52] U.S. Cl. ................................. 330/33; 307/308; 330/22; 330/30 D; 330/59
[51] Int. Cl.² ........................................... H03F 3/08
[58] Field of Search ............ 307/308; 330/22, 30 D, 330/33, 59

[56] References Cited
UNITED STATES PATENTS 3,619,799  11/1971  Oelke.................................... 330/33

Primary Examiner—R. V. Rolinec
Assistant Examiner—Lawrence J. Dahl
Attorney, Agent, or Firm—H. Christoffersen; Henry I. Schanzer

[57] ABSTRACT

A network for clamping a circuit node to a voltage level when the circuit is subjected to high radiation levels. The network includes a first resistor connected in series with a first radiation responsive element between said circuit node and a first point of potential and a second resistor connected in series with a second radiation responsive element between said circuit node and a second point of potential. In response to high radiation levels, the equivalent impedance of the radiation responsive elements decreases considerably and the potential at the circuit node is clamped to a voltage which is primarily determined by the potentials applied at said first and second points and the ratio of the first and second resistors.

9 Claims, 2 Drawing Figures

RADIATION RESPONSIVE VOLTAGE DIVIDING CIRCUIT

STATEMENT

The invention described herein was made in the course of or under a contract or subcontract thereunder, or grant with the Department of the Navy.

This invention relates to circuit means for enabling the quick recovery of semiconductor circuits subjected to high radiation levels and similar disturbances. Neutron and gamma ray radiation, as well as other types of radiation, incident on a reverse-biased semiconductor PN junction induce a leakage current across the junction. That is, leakage currents flow in the reverse direction from the N-region into the P region; from anode to cathode in diodes; from the collector to the base in NPN transistors; and from the base to the collector in PNP transistors.

Figure 1:
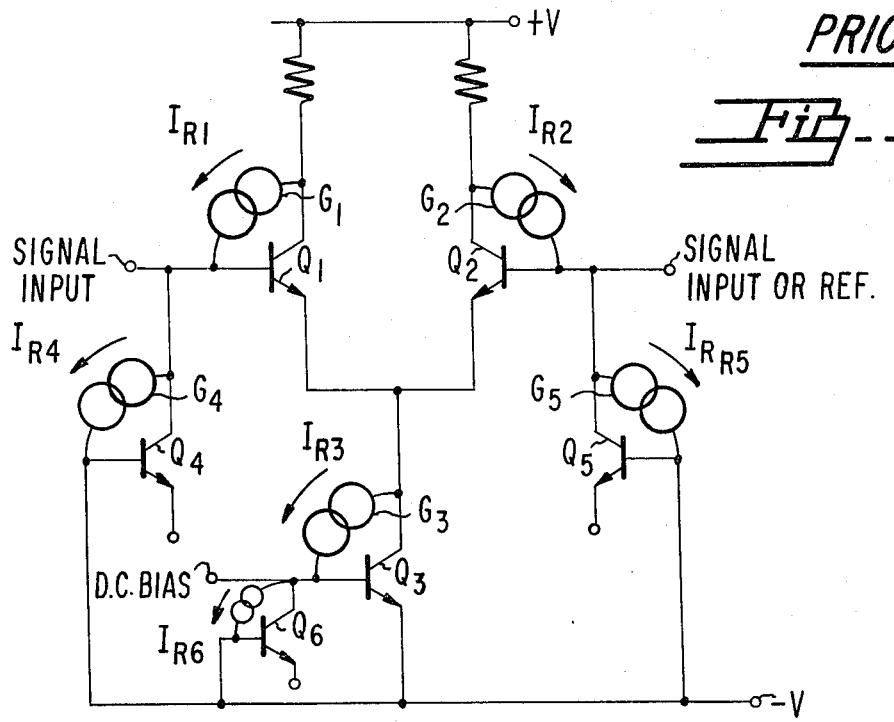
FIG. 1 is a schematic diagram of a differential amplifier including known leakage current compensating circuitry.

FIG. 1 shows a differential amplifier comprising NPN transistors Q1 and Q2 having their emitters connected to the collector of current sink transistor Q3. In response to incident radiation, leakage currents flow from the collector to the base of transistors Q1, Q2 and Q3. This is represented by current generators G1, G2 and G3 which produce radiation induced reverse (leakage) currents labelled $I_{R1}$, $I_{R2}$, and $I_{R3}$, respectively.

For a given range of radiation levels, referred to herein as low radiation levels, the reverse biased PN junctions behave like current generators producing a reverse current which is a linear function of and directly proportional to the radiation level and virtually independent of the potential across the junctions. It is known to compensate for the leakage current induced at low radiation levels by connecting a reverse-biased junction to the base of a transistor. Thus, in FIG. 1 the collector-to-base junctions of transistors Q4, Q5 and Q6, functioning as compensating diodes, are connected between the bases of transistors Q1, Q2 and Q3, respectively, and terminal 12 to provide conduction paths for the leakage currents of Q1, Q2 and Q3. The collector-to-base junction area of each one of transistors Q1, Q2 and Q3 is made substantially equal to the collector-to-base junction area of transistors Q4, Q5 and Q6, respectively. For this condition $I_{R1}$ is approximately equal to $I_{R4}$, $I_{R2}$ is approximately equal to $I_{R5}$ and $I_{R3}$ is approximately equal to $I_{R6}$. The reverse current flowing from collector-to-base of transistors Q1, Q2 and Q3 then flows through the collector-to-base of transistors Q4, Q5 and Q6, respectively. As a result, no leakage current flows back into the base of transistors Q1, Q2 and Q3 and there is no Beta multiplication of the leakage currents.

However, at high radiation levels the leakage current across a reverse-biased PN junction is no longer only a linear function of the radiation level. The leakage current across a junction becomes dependent on the reverse potential applied to the junction. For example, the potentials across the base-to-collector junctions of transistors Q1 and Q2 may be different from each other and different from those present across the base-to-collector junctions of transistors Q4 and Q5. Also, the base-to-collector potential across transistor Q3 may not be equal to that across transistor Q6. The leakage currents then no longer track each other. That is, $I_{R1}$ may not equal $I_{R4}$, $I_{R2}$ may not equal $I_{R5}$ and $I_{R3}$ may not equal $I_{R6}$. When the related currents are not equal, the high radiation level leakage current cannot be compensated by the simple expedient of connecting a reverse biased junction to the base of a transistor to draw off or compensate for the leakage current.

Uncompensated leakage currents flowing back into the base of transistors are Beta multiplied, causing problems in the intermediate and output stages of the amplifier. The problem of Beta multiplication of the leakage current can be avoided by connecting to the bases of the transistors compensating diodes which have much larger geometries than the collector-base junctions of the transistors. However, this adds capacitance and shunts the signal during normal operation, thereby adversely affecting the frequency response of the amplifier.

It should be noted that, at minimal radiation levels, the leakaage currents of reverse biased PN junctions, in commercially available digital and linear circuits, are in the range of nanoamperes. The equivalent impedance of a reverse biased junction is then in the order of hundreds of Megohms. In the specification, to follow, and in the claims appended hereto the term high equivalent impedance refers to a range of impedance varying approximately from $10^6$ to $10^{10}$ ohms. At radiation levels where the leakage current is a linear function of the incident radiation, the equivalent impedance of a reverse biased junction is lowered, varying from the low Megohm to high Kilohm range. At high radiation levels the equivalent impedance of a reverse biased junction may be in the range of ohms to Kilohms.

The invention resides in part in the recognition that at high radiation levels it is preferable to clamp selected circuit nodes to predetermined potentials and to place the circuit in a known condition rather than attempt to compensate for leakage currents.

The invention also resides in the circuit means for clamping a circuit node to which is coupled a reverse-biased semiconductor junction which passes a leakage current into the node when subjected to radiation. The clamping means includes a first impedance connected in series with a first element between said circuit node and a first point of operating potential and a second impedance connected in series with a second element between said circuit node and a second point of operating potential. The conductivities of said first and second elements are responsive to the radiation level. Each one of the first and second elements normally has a high equivalent impedance which decreases in response to radiation. At high radiation levels the impedances of the first and second elements are negligible in comparison to those of said first and second impedances, and the first and second impedances determine the ratio of the operating potential applied at the circuit node.

Figure 2:
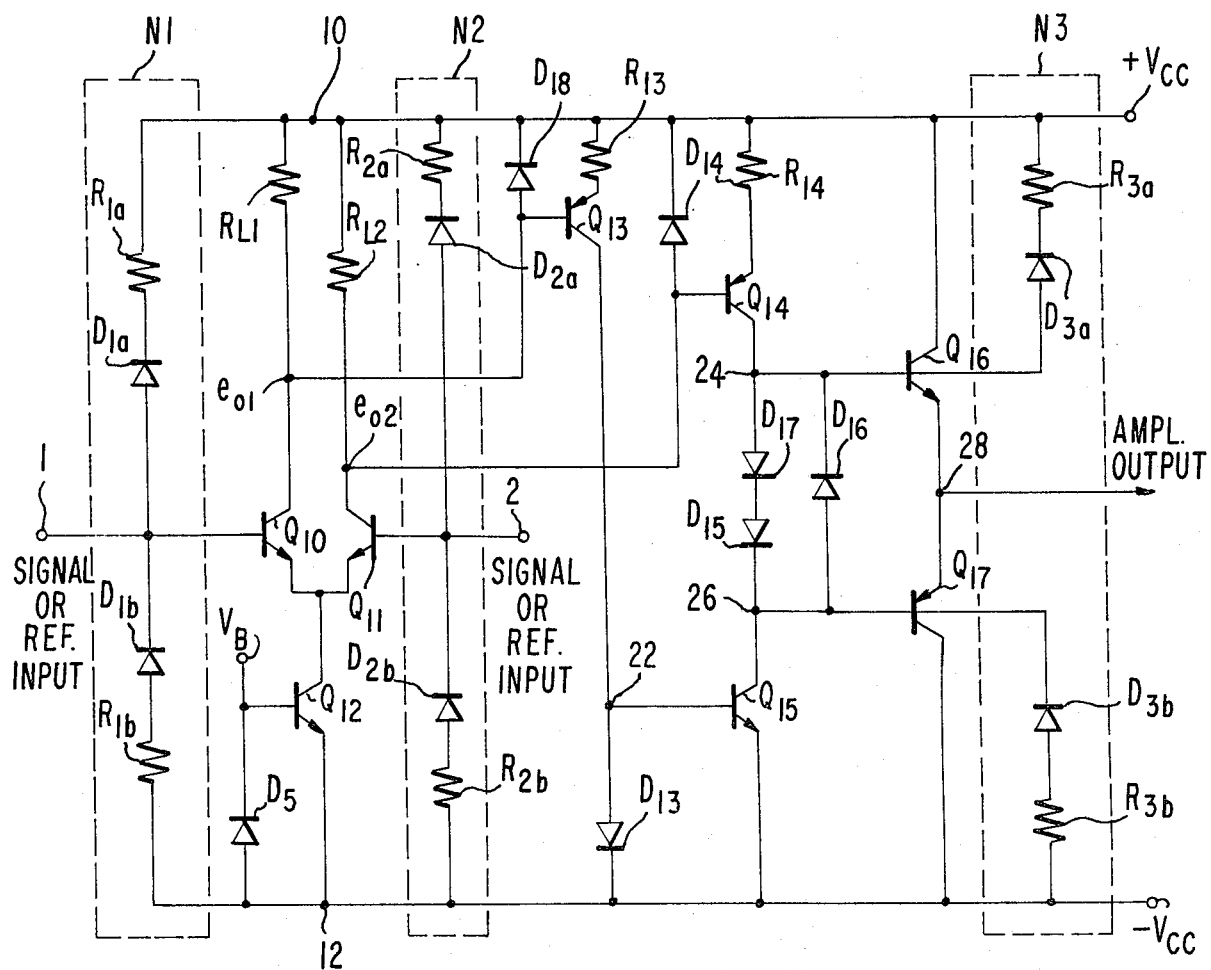
FIG. 2 is a schematic diagram of an amplifier including radiation responsive protective circuitry embodying the invention.

The circuit of FIG. 2 includes a differential amplifier input stage comprising transistors Q10 and Q11. The bases of NPN transistors Q10 and Q11 are connected to signal input terminals 1 and 2, respectively. The collectors of transistors Q10 and Q11 are coupled by means of resistors RL1 and RL2, respectively, to terminal 10 to which is applied the most positive operating potential, $+V_{cc}$. The emitters of transistors Q10 and Q11 are connected in common to the collector of current sink transistor Q12. The emitter of transistor Q12 is connected to terminal 12, to which is applied the most negative operating potential $-V_{cc}$. A fixed bias potential, $V_B$, is applied to the base of transistor Q12 for causing a substantially constant current in transistor Q12. Diode D5 is connected at its cathode and anode to the base and emitter, respectively, of transistor Q12 for conducting to terminal 12 the radiation induced leakage current flowing into the base of transistor Q12.

A resistor in series with a diode poled to block conduction between the power supply terminals is connected between the base of each one of the differential amplifier transistors (Q10, Q11) and each one of the power terminals (10, 12) for forming radiation responsive clamping networks. The first clamping network, N1, includes resistor R1a connected in series with diode D1a between terminals 1 and 10 and resistor R1b connected in series with diode D1b between terminals 1 and 12. In a similar fashion the second clamping network, N2, includes resistor R2a connected in series with diode D2a between terminals 2 and 10 and resistor R2b connected in series with diode D2b between terminals 2 and 12.

The intermediate stage of the amplifier includes transistors Q13 and Q14 connected at their bases to the collectors of transistors Q10 and Q11, respectively, and at their emitters through current limiting resistors R13, R14, respectively, to terminal 10. Reverse-biased diodes D18 and D14 connected between terminal 10 and the bases of transistors Q13 and Q14, respectively, provide some leakage current compensation to their respective transistors. Transistor Q13 is connected at its collector to node 22 to which is connected the anode of diode D13 and the base of transistor Q15. The cathode of diode D13 and the emitter of transistor Q15 are connected to terminal 12. Transistor Q14 is connected at its collector to node 24 to which is connected the base of transistor Q16, the anode of diode D17 and the cathode of diode D16. Diodes D17 and D15 are series connected to conduct current from node 24 to node 26. At node 26 is connected the collector of transistor Q15, the anode of diode D16 and the base of transistor Q17.

The output stage includes NPN transistor Q16, connected at its collector to terminal 10 and at its emitter to the amplifier output terminal 28, and PNP transistor Q17, connected at its emitter to terminal 28 and at its collector to terminal 12. A clamping network N3, for the output stage includes Resistor R3a connected in series with reverse biased diode D3a between terminal 10 and the base of transistor Q16, and resistor R3b connected in series with reverse biased diode D3b between the base of transistor Q17 and terminal 12. Depending on the radiation and conduction levels, current can flow from node 24 to node 26 along any of the following three paths: (a) diodes D15, D17; (b) diode D16; and (c) the base-to-emitter junctions of transistors Q16 and Q17.

Note that the collector-to-base junctions of transistors Q16 and Q17 may be used to perform the functions of diodes D3a and D3b, respectively. In that case, diodes D3a and D3b would be eliminated and current limiting resistors would be connected between the collectors of transistors Q16 and Q17 and their respective points of operating potential. Also, the device geometries of transistors Q16 and Q17 would be designed to ensure that the two devices produce approximately equal leakage currents.

The diodes D1a, D1b, D2a, D2b, D3a, D3b in the clamping networks preferably having larger junction areas than the collector-to-base junctions of their respective transistors whose leakage current they compensate. Therefore, when subjected to radiation, the diodes in the clamping network pass larger currents than their respective transistors and have great control over the potential at the nodes to which they are connected.

The operation of the amplifier of FIG. 2 without the clamping networks and at very low (minimal) radiation levels is well known and need not be described in great detail. The input signals is applied between terminals 1 and 2 control the division of current in transistors Q10 and Q11. When transistor Q10 conducts more current, transistor Q11 conducts less current, and vice versa. In response to differential input signals, signals of opposite phase are produced at the collectors of transistors Q10 and Q11 and are applied to the bases of transistors Q13 and Q14. Thus, the signals applied to the base of transistor Q13 are the inverse of the signals applied to the base of transistor Q14. In response to the signals applied to their bases, transistors Q13 and Q14 produce amplified currents in their collector-to-emitter paths which are supplied to the bases of transistors Q15 and Q16, respectively. Under normal operating conditions transistors Q13 and Q14 produce signal currents of opposite polarity. Increasing the base drive to transistors Q15 causes it to conduct increased collector current which is drawn primarily from the base of transistor Q17. This in turn increases the collector-to-emitter current flowing in transistor Q17, causing the potential at output terminal 28 to decrease.

When the conductivity of transistor Q14 is increased (i.e. the signal at the collector of transistor Q13 is decreased) an increased current flows into node 24 in a direction to increase the conduction of transistor Q16 and to reverse bias transistor Q17. Increasing the base current into transistor Q16 causes an increased current in the collector-to-emitter path of transistor Q16 and raises the potential at the amplifier output terminal 28.

The operation of the amplifier with the clamping networks may now be examined for three ranges of radiation levels.

a. At minimal radiation levels the reverse-biased diodes (D1a, D1b, D2a, D2b, D3a, D3b) of the clamping networks N1, N2 and N3 have relatively high impedances. The back resistance from cathode to anode of each of these devices is in the order of Megohms. The impedances of the signal sources (not shown) connected to terminals 1 and 2 and the impedance of any load (not shown) connected to the amplifier output 28 are much lower than the impedances of the clamping networks. Therefore, the clamping networks N1, N2 and N3 have little effect on the potentials at the nodes to which they are connected. The net effect of the clamping networks is to add some capacitance to the nodes to which they are connected, but the amplifier operates, basically, as if the clamping networks were not present.

b. At radiation levels at which the leakage current is a linear function of the radiation levels, the reverse-biased diodes of the clamping networks function as current generators. The clamping networks provide conduction paths for drawing out (compensating) the leakage currents present at the bases of the associated transistors. For example, leakage currents flowing into the base of transistors Q10 and Q11 are conducted out of the base regions to terminal 12 by means of diode D1b and resistor R1b and diode D2b and resistor R2b. With respect to the output stage, the leakage current into the base of transistor Q16 as well as the leakage current from resistor R3a and diode D3a flows from node 24 to node 26 through diode D16 and/or through the series combination of diodes D17 and D15. The leakage current into node 26 flows, predominantly, through diode D3b and resistor R3b to terminal 12. The leakage current into the base of transistor Q17 also flows through diode D3b and resistor R3b to terminal 12. Transistors Q14 and Q15 also interact with the output stage. Transistor Q14 introduces leakage current into node 24 and transistor Q15 draws leakage current out of node 26. The clamping networks produce greater loading effect on terminals 1 and 2 than for the case of minimal radiation. However, the driving impedances of the signal sources are still considerably less than the impedances of the clamping networks and any input signal is amplified.

c. At high radiation levels the leakage currents across reverse-biased junctions become dependent, in part, on the potentials applied across the junctions. The back resistances or reverse impedances of the PN junctions decrease considerably and high reverse or leakage currents can flow across the junctions. Note that the collector-to-base regions of all the transistors in the circuit (unless driven into saturation) are reverse biased junctions.

As stated above, diodes D1a, D1b, D2a, D2b, D3a and D3b are designed to have large junction areas to enable the conduction of large currents in the reverse direction. At the radiation levels at which the leakage current is no longer a linear function of the radiation level but becomes dependent, in part, on the potential applied across a junction, the diodes in the clamping networks become highly conductive. The equivalent impedances of the clamping networks decrease and become the dominating factor in determining the potential at terminals 1, 2 and 28. The clamping networks from voltage divider networks which clamp the circuit node to which they are connected to a value intermediate the operating potential applied between terminals 10 and 12. For example, assume the driving impedances of the signal sources (not shown) connected to terminals 1 and 2 and the input impedances into the bases of transistors Q10 and Q11 to be in the range of 5 Kilohms or more. At high radiation levels the equivalent impedances of the clamping networks are much less, being, for example, in the range of 1 Kilohm each.

For a multiplicity of reasons (e.g. differences in input signals) the collector-to-base potential of transistor Q10 may be different than the collector-to-base potential of transistor Q11. As a result, the leakage currents flowing into the bases of transistors Q10 and Q11 may be different from each other. These different leakage currents flow through diodes D1b and resistor R1b or diode D2b and resistor R2b to terminal 12. However, these currents, even if different, do not have a marked effect on the potential at the bases of transistor Q10 and Q11, for they are only a small portion of the current flowing through the clamping networks. Therefore, it is the clamping networks which primarily determine the potential at terminals 1 and 2 and prevent saturation of the differential input stage (transistors Q10, Q11).

At some high radiation level, the equivalent reverse impedances of the diodes in the clamping networks become negligible. At that point, resistors R1a, R1b form a voltage divider network which determines the potential applied to the base of transistor Q10. Similarly, resistors R2a and R2b then form a voltage divider network which determines the potential applied to the base of transistor Q11. Similarly, resistors R3a and R3b form a voltage divider which determines the potential at terminal 28. By way of example, resistors R1a, R1b, R2a and R2b may be of the order of 500 Ohms. Since the impedance of the driving source as well as the input impedances into the base of transistors Q10 and Q11 is an order of magnitude or more greater than 500 Ohms, the divider network resistors determine the potential at terminals 1, 2 and 28. For the condition where the resistance of R1a equals R1b, R2a equals R2b and R3a equals R3b, the potentials at terminals 1, 2 and 28 will be approximately equal to one-half the potential applied between terminals 10 and 12. The two input terminals of the differential amplifier as well as the output terminal are then clamped to a fixed and known potential. This fixed potential overrides any input signal applied to terminal 1 and terminal 2. Since under conditions of intense radiation the input signal information is valueless it is advantageous to prevent the possible distortion of amplifier characteristics and the possible destruction of the amplifier. It should be noted that as soon as the radiation level decreases, diodes D1a, D1b, D2a, D2b return to their normal high impedance levels (reverse biased condition), allowing the amplifier to operate in its typical manner. It should also be appreciated that networks N1 and N2 form a radiation responsive bridge network.

In the actual design of the amplifier, diodes D1b and D2b may be made slightly larger than diodes D1a and D2a and the ohmic values of resistors R1b and R2b may be made slightly lower than R1a and R2a in order to compensate for the additional leakage current flowing into terminals 1 and 2 from the collector-to-base regions of transistors Q10 and Q11.

To overcome the problems of radiation it is insufficient to attend only to the input of the amplifier. Clamping networks for the intermediate stage (transistors Q13 and Q14) are not shown but could be provided. At high radiation levels, control may be lost in the intermediate stages of the amplifier and clamping network N3 is provided to control the output of the amplifier. One half of the network includes resistor R3a and diode D3a and the other half of the network inlcudes diode D3b and resistor R3b. When diodes D3a and D3b become highly conductive, current flows from terminal 10 through resistor R3a across diode D3a, through diode D16 (which presumably now has a very low impedance) and/or the other conduction paths connected between nodes 24 and 26, across diode D3b and through resistor R3b to terminal 12. The base-to-emitter drop of transistor Q16 is substantially equal to that of transistor Q17 and one cancels the other. It is evident that the potential at terminal 28 will be approximately equal to one-half the potential applied across the operating terminals for the condition R3a equal to R3b.

It should be appreciated that any circuit node, whether of a linear or digital circuit, could be clamped, as taught above, to a fixed point of potential when the circuit is subjected to high radiation levels.

It should also be appreciated that other radiation responsive clamping circuits are included within the scope of the invention.

What is claimed is:

1. In a circuit having a circuit node to which is coupled a reverse-biased semiconductor junction which passes a leakage current when subjected to incident radiation, means for clamping said node to a predetermined voltage at radiation levels higher than some predetermined level including:
   first and second terminals for the application therebetween of an operating potential;
   first and second impedances;
   first and second radiation responsive elements, said elements being of the type which in the absence of radiation have a high equivalent impedance which decreases in response to radiation;
   means connecting said first impedance in series with said first element between said first terminal and said circuit node; and
   means connecting said second impedance in series with said second element between said second terminal and said circuit node.

2. The circuit as claimed in claim 1 wherein said radiation responsive elements are PN junction diodes operated in the reverse-biased condition.

3. The circuit as claimed in claim 1 wherein said first and second impedances are resistors.

4. The circuit as claimed in claim 3 wherein said reverse-biased semiconductor junction is the collector-to-base junction of a transistor.

5. The circuit as claimed in claim 4 wherein the base of said transistor is coupled to said circuit node; and
   wherein the impedances of said resistors are lower than the input impedance into the base of said transistor.

6. The circuit as claimed in claim 4 wherein said first and second resistors are of equal value.

7. In a differential amplifier having first and second transistors in which the emitters are coupled to a first point of operating potential, the collectors are coupled to a second point of operating potential, the base of the first transistor is coupled to a first input terminal and the base of the second transistor is coupled to a second input terminal, and in which leakage current flows between the base and collector of each transistor when the amplifier is subjected to radiation, the improvement comprising:
   first, second, third and fourth impedances;
   first, second, third and fourth radiation responsive elements, each one of said element being of a type which, in the absence of radiation, has a high equivalent impedance relative to the impedance of said first, second, third and fourth impedances and whose impedance decreases in response to radiation;
   means connecting said first impedance in series with said first element between said first input terminal and said first point of operating potential;
   means connecting said second impedance in series with said second element between said first input terminal and said second point of operating potential;
   means connecting said third impedance in series with said third element between said second input terminal and said first point of operating potential; and
   means connecting said fourth impedance in series with said fourth element between said second input terminal and said second point of operating potential.

8. The improved differential amplifier as claimed in claim 7 wherein said impedances are resistors; and
   wherein said radiation responsive elements are reverse-biased PN junctions.

9. The improved differential amplifier as claimed in claim 7 wherein said amplifier has an output stage, means coupling the collectors of said first and second transistors to said output stage, and said output stage has an output terminal, and wherein the improvement further includes:
   fifth and sixth impedances and fifth and sixth radiation responsive elements;
   means coupling said fifth impedance in series with said fifth element between said output terminal and said first point of operating potential; and
   means coupling said sixth impedance in series with said sixth element between said output terminal and said second point of operating potential.

* * * * *